United States Patent
Hsu

(10) Patent No.: US 7,312,405 B2
(45) Date of Patent: Dec. 25, 2007

(54) MODULE STRUCTURE HAVING EMBEDDED CHIPS

(75) Inventor: Shih-Ping Hsu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 0 days.

(21) Appl. No.: 11/273,752

(22) Filed: Nov. 14, 2005

(65) Prior Publication Data
US 2006/0170098 A1   Aug. 3, 2006

(30) Foreign Application Priority Data
Feb. 1, 2005  (TW) .............................. 94102994 A

(51) Int. Cl.
*H01R 12/04* (2006.01)
*H05K 1/11* (2006.01)
(52) U.S. Cl. .................. 174/262; 361/763; 361/792
(58) Field of Classification Search ........ 174/260–266; 361/763, 764, 792–795
See application file for complete search history.

(56) References Cited

U.S. PATENT DOCUMENTS

| | | | | |
|---|---|---|---|---|
| 5,338,975 | A | * | 8/1994 | Cole et al. .................. 257/750 |
| 6,787,895 | B1 | * | 9/2004 | Jarcy et al. ................. 257/698 |
| 2003/0133274 | A1 | * | 7/2003 | Chen et al. ................. 361/760 |
| 2006/0012966 | A1 | * | 1/2006 | Chakravorty ............... 361/763 |

* cited by examiner

*Primary Examiner*—Jeremy C Norris
(74) *Attorney, Agent, or Firm*—Sawyer Law Group LLP

(57) ABSTRACT

A module structure having embedded chips mainly comprises a dielectric layer, at least a semiconductor chip embedded in the dielectric layer, and at least a circuit structure formed on the surface of the dielectric layer, the circuit structure electrically connected to the semiconductor chip via a plurality of conductive structures formed in the dielectric layer, for embedding the module structure in an electronic device, and electrically connecting the electronic device via the circuit structure on the surface of the dielectric layer.

17 Claims, 3 Drawing Sheets

MODULE STRUCTURE HAVING
EMBEDDED CHIPS

FIELD OF THE INVENTION

The present invention relates to a module structure having embedded chips, and more specifically, to a module structure integrated with at least a semiconductor chip.

BACKGROUND OF THE INVENTION

With the rapid development of electronic industry, electronic products are developed toward a direction of light, thin, short, small, high integration and multi-functional. To meet the demand of high integration and miniaturization to the package of semiconductor packages, conventional BGA or FC (Flip Chip) package of a single chip evolves to 3D package and module package, therefore generating many structures of the packages, such as SiP (System in Package), SIP (System Integrated Package) and SiB (System in Board).

However, such 3D and module packages attach single chips one by one to the surface of a carrier via flip chip or wire bonding technology; or adhere chips to the surface of the carrier via SMT technology. Although such packages apply module design and package to a plurality of different elements, however such packages demand high technology and cost a lot, wherein multi-function and modularization are achieved, while the electrically connections and properties of the crowded elements may be restricted because of noise signal. In addition, it become more difficult for the layout on the surface of the carrier because of the limitation of the area and size of the element; and it is not good for the decrease of the size of the module package and the enhancement of the property because all elements will be laid on the surface of the substrate.

Consequently, method of substrate having embedded chips is brought forward. As shown in FIG. 1, a schematic section view of a package with a substrate having embedded chips is illustrated. As shown in the figure, the package comprises a carrier 10, at least an opening 100a defined in a surface 100 of the carrier 10; at least a semiconductor chip 11, a plurality of electrical connection pads 110 formed on the semiconductor chip 1, attached on the carrier 10 and accommodated in the opening 100a; an circuit multilayer structure 12 formed on the carrier 10, and the circuit multilayer structure 12 electrically connected to the electrical connection pads 110 on the semiconductor chip 11 via a plurality of blind holes 120.

The semiconductor chip 11 comprises an active surface 11a and a non-active surface opposing the active surface, a plurality of electrical connection pads 110 are formed on the active surface 11a, the non-active surface 11b are attached to the opening 100a of the carrier via adhesive 13.

The circuit multilayer structure 12 comprises at least dielectric layer 121, a circuit layer 122 overlapping the dielectric 121, and a plurality of conductive blind holes 120 extending through the dielectric layer 121 to electrically connect the circuit layer 122, so that the plurality of conductive blind holes 120 electrically connects the electrical connection pads 110 on the semiconductor chip 11 accommodated in the opening 100a of the carrier. A plurality of electrical connection ends 123 is formed on the circuit layer on the outmost surface of the circuit multilayer structure 12, and a solder mask layer 124 is coated on the outmost surface of the circuit multilayer structure. The solder mask layer 124 defines a plurality of openings to expose the electrical connection ends 123 for mounting conductive elements, such as solder balls 125, so that the semiconductor chip 11 accommodated in the carrier 10 electrically connects external elements via the electrical connection pads 110, circuit multilayer structure 12 and solder balls 125 on the surface thereof.

The above package structure greatly increases the chips density and electrical property thereof; however, the embedded semiconductor chips are generally in a single form, which do not form a multifunctional module structure. In addition, under the circumstance of being used in multichips structure, each of the plurality of chips have to be electrically connected respectively, which consumes a great deal of fabricating time and cost, and is unsuitable for mass production.

Consequently, how to provide a multifunctional, high density module structure having embedded chips for shortening the length of layout, simplifying fabricating, enhancing the electrical property and adapting to mass production, thus avoiding the deficiencies of conventional technology, has become a problem desired to be solved.

SUMMARY OF THE INVENTION

Regarding the drawbacks of the above mentioned conventional technologies, the primary objective of the present invention is to provide a multifunctional and high density module structure having embedded chips.

Another objective of the present invention is to provide a module structure having embedded chips which shortens the length of layout and enhances the electrical property thereof.

Still another objective of the present invention is to provide a module structure having embedded chips which is embedded in electronic devices, such as circuit board, IC substrate, or semiconductor devices like mother board, module card and so on, thus providing a module structure having embedded chips employed in the fabricating process of electronic devices which is suitable for mass production.

In accordance with the above and other objectives, the present invention proposes a module structure having embedded chips comprising a dielectric layer; at least a semiconductor chip embedded in the dielectric layer; and at least a circuit structure formed on the surface of the dielectric layer, the circuit structure electrically connected to the semiconductor chip via a plurality of conductive structures formed in the dielectric layer, thus embedding the module structure in an electronic device, and electrically connecting the electronic device via the circuit structure formed on the surface of the dielectric layer.

In an alternative embodiment, the present invention proposes a module structure having embedded chips comprising a first dielectric layer; at least a semiconductor chip comprising an active surface and a non-active surface opposing the active surface, the semiconductor chip attached to the first dielectric layer via the non-active surface, a plurality of electrical connection pads formed on the active surface; a second dielectric layer formed on the first dielectric layer, for embedding the semiconductor chip between the first and second dielectric layers; and a circuit structure formed on the second dielectric layer, the circuit structure electrically connected to the electrical connection pads on the active surface of the semiconductor chip via a plurality of conductive structures, thus embedding the module structure in an electronic device, and electrically connecting the electronic device via the circuit structure on the surface thereof. Wherein the module structure having embedded chips further comprises another circuit structure formed on the outer surface of the first dielectric layer, and a conductive structure extending through the first and second dielectric layers for electrically connecting the circuit structures on the surface thereof, thus providing better electrical property.

In another alternative embodiment, the present invention, the present invention proposes a module structure having embedded chips, which is different from the above embodiments in that, a core layer further arranged between a first and a second dielectric layers, the core layer defining at least an opening, the semiconductor chip attached to the first dielectric layer and accommodated in the opening of the core layer, filling the first and second dielectric layers into the opening of the core layer thus securing the semiconductor chip in the opening of the core layer, and at least forming a circuit structure on the second dielectric layer for electrically connecting the semiconductor chip.

In following processes, the module structure having embedded chips can be employed in the fabricating process of various kinds of electronic devices to embedding module structure in the electronic devices, so that the circuit structure formed on the surface of the module structure can be electrically connected to other electronic devices via various kinds of conductive structures (such as conductive blind holes, conductive bumps, or plated conductive through hole), thus shortening the length of layout, enhancing electrical property and providing multifunctional and high density electronic devices. At the same time, in the fabricating of electronic devices, fabricating time can be saved via integrating pre-fabricated module structure having embedded chips, which is suitable for mass production.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the invention. The present invention is also implemented and applied according to other embodiments, and details are modified based on different views and applications without departing from the spirit of the invention.

It is to be noted that the module structure having embedded chips of the present invention embeds at least a semiconductor chip; to compactly describe the advantage and function of the present invention. The following embodiments exemplarily illustrate the module structure of the present invention with only two semiconductor chips embedded, however, which shall not be regarded as a limitation to the scope of the present invention.

Figure 1:
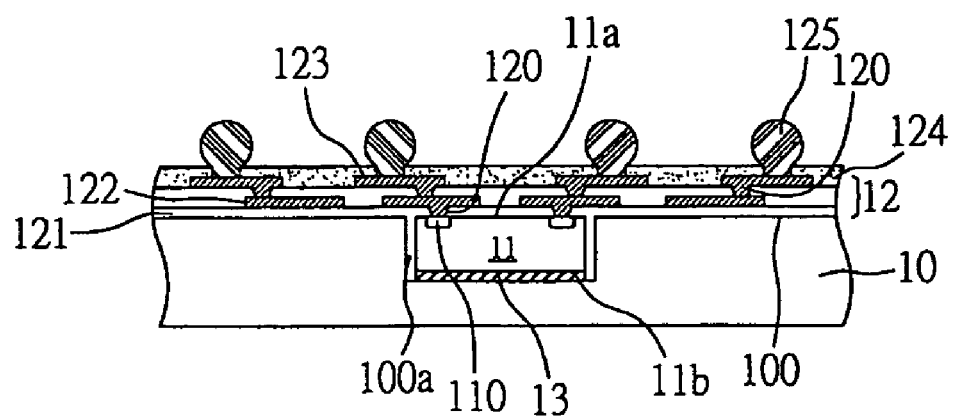
FIG. 1 is a schematic section view of a conventional semiconductor package.
Figure 2:
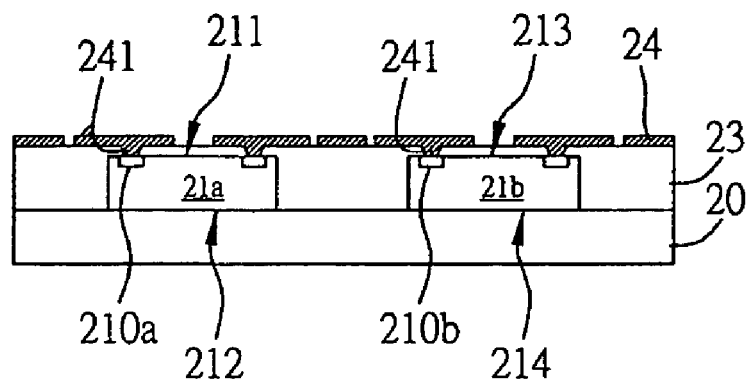
FIG. 2 is a schematic section view of a module structure having embedded chips in accordance with a first embodiment of the present invention.

Referring to FIG. 2, a schematic section view in accordance with a first embodiment of the present invention is illustrated. As shown in the figure, the module structure having embedded chips comprises: a first dielectric layer 20; semiconductor chips 21a, 21b attached to the first dielectric layer 20, a plurality of electrical connection pads 210a, 210b on the semiconductor chips 21a, 21b; a second dielectric layer 23 pressed or coated on the first dielectric layer 20, so that the semiconductor chips 21a, 21b are embedded between the first dielectric layer 20 and the second dielectric layer 23; and a circuit structure 24 formed on the second dielectric layer 23, the circuit structure 24 electrically connected the electrical connection pads 210a, 210b on the semiconductor chips 21a, 21b via a plurality conductive structures 241 (for example, conductive blind holes or bumps) formed in the second dielectric layer 23. Thus the module structure can be embedded in electronic devices, such as circuit boards like mother board and daughter cards, IC substrates and semiconductor devices; and electrically connected to the electronic devices via the circuit structure 24 formed on the second dielectric layer 23.

The first dielectric layer 20 is made of dielectric materials, such as FR-4 resin of film type or liquid type, FR-5 resin, Epoxy, Polyesters, Cyanate ester, Polyimide, Bismaleinmide Triazine (BT), Ajinomoto Build-up Film (ABF), Aramide resin or mixed Epoxy glass fiber.

The semiconductor chip 21a comprises an active surface 211 and a non-active surface 212 opposing the active surface. The active surface 211 of the semiconductor chip 21a forms the electrical connection pads 210a; the non-active surface 212 of the semiconductor chip 21a is attached on the first dielectric layer 20. The semiconductor chip 21a can be selected as active chip or passive chip, such as one of the capacitor chip, resistor chip, memory chip, application specific integrated circuit (ASIC) chip, photoelectric element and microprocessor chip.

The semiconductor chip 21b comprises an active surface 213 and a non-active surface 214 opposing the active surface. The active surface 213 of the semiconductor chip 21b forms the electrical connection pads 210b; the non-active surface 214 of the semiconductor chip 21b is attached on the first dielectric layer 20. The semiconductor chip 21b can be selected as active chip or passive chip, which can be identical to or different from that of the semiconductor chip 21a.

The second dielectric layer 23 is pressed or coated on the first dielectric layer 20, so that the semiconductor chips 21a, 21b are embedded in the insulator formed by the first and second dielectric layers 20, 23. The second dielectric layer 23 can be selected to be made of a material identical to or different from that of the first dielectric layer 20 in accordance with various requirements.

The circuit structure 24 is formed on the second dielectric layer 23. The circuit structure 24 can be electrically connected to the electrical connection pads 210a, 210b on the semiconductor chips 21a, 21b via the plurality of conductive structure 241, such as conductive blind holes or conductive bumps, formed in the second dielectric layer 23. The forming method of the circuit structure 24 is conventional technology and known to those skilled in the art, which will not be detailed hereinafter.

Figure 3:
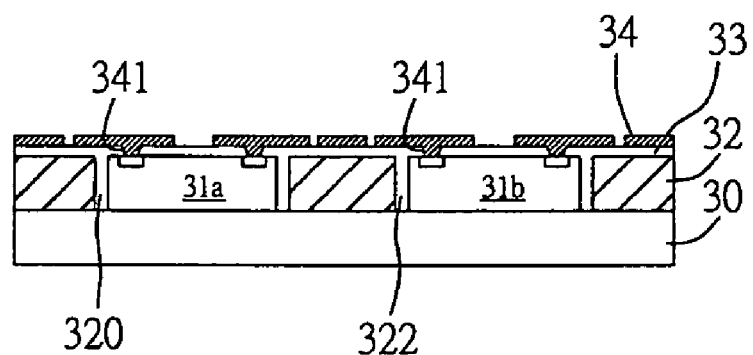
FIG. 3 is a schematic section view of the module structure having embedded chips in accordance with a second embodiment of the present invention.

Referring to FIG. 3, a schematic section view in accordance with a second embodiment of the present invention is illustrated. The structure of the present embodiment is similar to that of the first embodiment, and only the different parts thereof will be described hereinafter. As shown in the figure, the main difference lies in that, a core layer 32 is further arranged between the first dielectric layer 30 and the second dielectric layer 33; and the core layer 32 defines through holes 320, 322 for accommodating the semiconductor chips 31a, 31b. When the second dielectric layer 33 is pressed or coated on the first dielectric layer 30, sandwiching the core layer 32, the first and second dielectric layers 30, 33 are filled into the openings 320, 322 so that the semiconductor chips 31a, 31b are embedded in the corresponding openings, and electrically connected to external devices via the circuit structure 34 formed on the second dielectric layer 33 and the conductive structures 34. Wherein, the core layer 32 can be made of organic material, metal or ceramic material.

Figure 4:
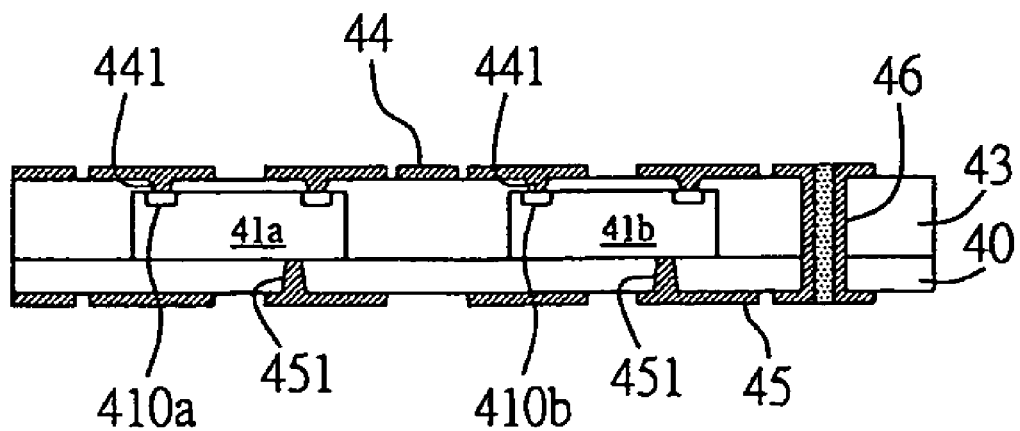
FIG. 4 is a schematic section view of the module structure having embedded chips in accordance with a third embodiment of the present invention.

Referring to FIG. 4, a schematic section view in accordance with a third embodiment of the present invention is illustrated. As shown in the figure, the module structure having embedded chips comprises: a first dielectric layer 40; semiconductor chips 41a, 41b attached to the first dielectric layer 40, a plurality of electrical connection pads 410a, 410b on the semiconductor chips 41a, 41b; a second dielectric layer 43 pressed or coated on the first dielectric layer 40, so that the semiconductor chips 41a, 41b are embedded between the first dielectric layer 40 and the second dielectric layer 43; a circuit structure 44 formed on the second dielectric layer 43, the circuit structure 44 electrically connected the electrical connection pads 410a, 410b on the semiconductor chips 41a, 41b via a plurality of conductive structures 441; a circuit structure 45 formed on the outer surface of the first dielectric layer 40; and a conductive through hole 46 extending through the first and second dielectric layers 40, 43 for electrically connecting the circuit structures 44, 45 formed on the outer surface of the first and second dielectric layers.

The circuit structure 44 is formed on the second dielectric layer 43, and the circuit structure 44 is electrically connected to the electrical connection pads 410a, 410b on the active surfaces of the semiconductor chips 44a, 44b via the plurality of conductive structures 441 (for example conductive blind holes or bumps) formed in the second dielectric layer 43. The circuit structure 45 is formed on the first dielectric layer 40, and the circuit structure 45 is connected to the non-active surfaces of the semiconductor chips 41a, 41b via also the plurality of conductive structures 441 (for example conductive blind holes or bumps). The conductive structures 451 and partial circuit structure 45 can be employed to provide better heat dissipating means for the semiconductor chips 41a, 41b. At the same time, the circuit structures 45, 44 formed on the first and second dielectric layer 40, 43 may be electrically connected to each other via the conductive through hole 46, for further electrically integrating and enhancing the electrical property thereof.

Figure 5:
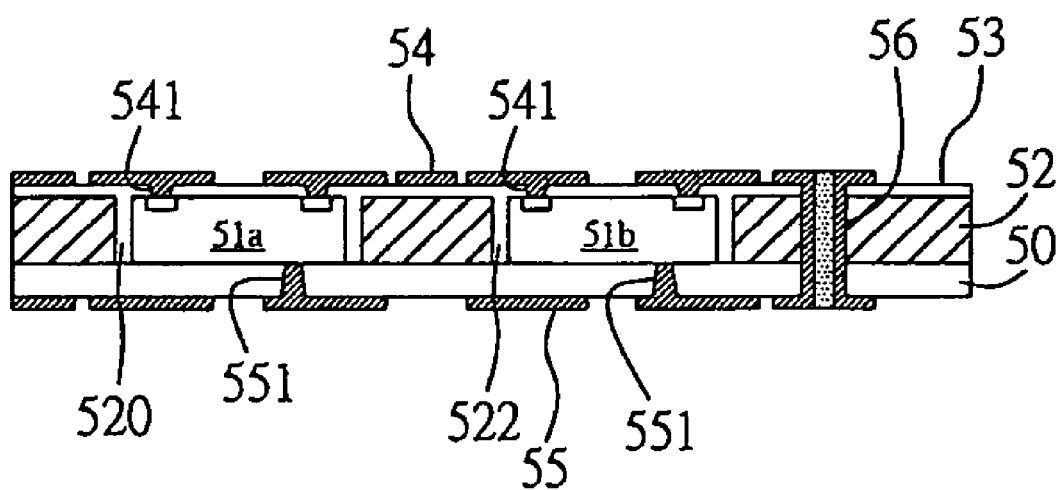
FIG. 5 is a schematic section view of the module structure having embedded chips in accordance with a forth embodiment of the present invention.

Referring to FIG. 5, a schematic section view in accordance with a forth embodiment of the present invention is illustrated. The structure of the present embodiment is similar to that of the third embodiment, and only the different parts thereof will be described hereinafter. As shown in the figure, the main difference lies in that, a core layer 52 is further arranged between the first dielectric layer 50 and the second dielectric layer 53; and the core layer 52 defines through holes 520, 522 for accommodating the semiconductor chips 51a, 51b. When the second dielectric layer 53 is pressed or coated on the first dielectric layer 50, sandwiching the core layer 52, the first and second dielectric layers 50, 53 are filled into the openings 520, 522 so that the semiconductor chips 51a, 51b are embedded in the corresponding openings, wherein the core layer 52 can be made of organic material, metal or ceramic material.

Additionally, circuit structures 54, 55 are formed on the first and second dielectric layers 50, 53, and the circuit structures 54, 55 are respectively connected to the active surface and non-active surface of the semiconductor chips 51a, 51b via a plurality of conductive structures 541, 551. Thus the semiconductor chips 51a, 51b can be electrically expanded via the conductive structure 541 and the circuit structure 54, and the heat thereof can be effectively dissipated via the conductive structure 551 and the circuit structure 55. At the same time, the circuit structures 55, 54 formed on the first and second dielectric layer 50, 53 may be electrically connected to each other via the conductive through hole 56, for further electrically integrating and enhancing the electrical property thereof.

Consequently, the feature of the module structure having embedded chips of the present invention mainly is to embed the semiconductor chips in the dielectric layers, so that in the following package process, the semiconductor chips can be electrically connected to external electronic devices via the circuit structures thereof, thus providing more package flexibility to the following fabricating process.

Compared to conventional technology, the module structure having embedded chips of the present invention embeds at least a semiconductor chip in the dielectric material, and the semiconductor chips can be electrically connected via the electrical connection pads thereof, thus shortening the length of layout, enhancing the electrical property thereof, increasing the package density, and providing a multifunctional module structure.

Additionally, the heat generated by the semiconductor chips can be conducted to the heat dissipating path formed by the circuit structures via the conductive structures and effectively dissipated, therefore enhancing the operation property of the module structure. In addition, the module structure having embedded chips of the present invention can be further packed in order to form multifunctional, high density and high capability electronic devices.

Figure 6:
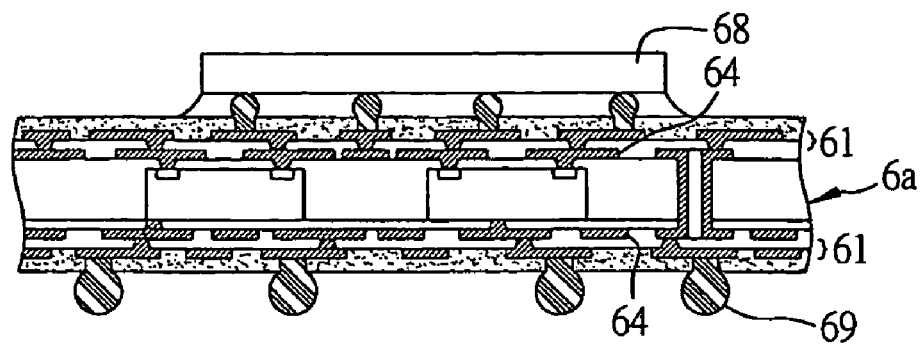
FIGS. 6-8 are schematic section views of an electronic device integrated with the module structure having embedded chips of the present invention.
Figure 7:
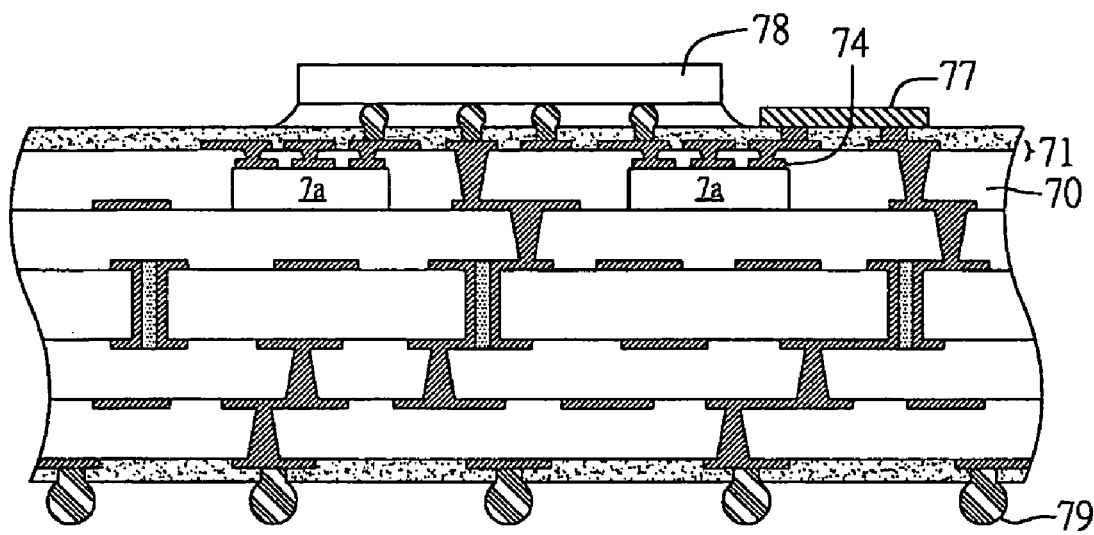
Figure 8:
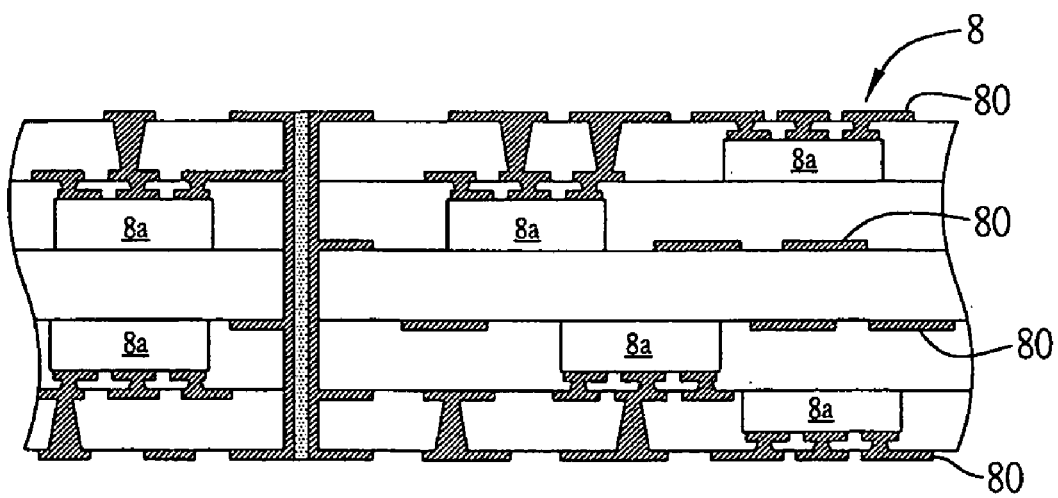

FIG. 6 to FIG. 8 are schematic section views of a package formed by further packing the module structure having embedded chips of the present invention.

Referring to FIG. 6, a section view of a semiconductor package formed by the above module structure having embedded chips further embedded in an IC substrate is illustrated. For the reason of simplification, the module structure having embedded chips of the third embodiment is used as an example for the description, however, which shall not be regarded as a limitation to the scope of the present invention.

As shown in the figure, the module structure having embedded chips 6a serves as a core layer of the IC substrate. A process of adding circuit layer is processed to the module structure having embedded chips 6a to form a circuit multilayer structure 67. The circuit multilayer structure 67 can be electrically connected to the circuit structure 64 on the surface of the module structure having embedded chips 6a, so that the surface circuit of the circuit multilayer structure 67 can be electrically connected to external electronic devices, for example connected to at least a semiconductor chip 68 on the upper surface of the substrate, and a plurality of solder balls 69 planted on the lower surface of the substrate. Alternatively, in the fabricating process, the module structure having embedded chips can be directly embedded in the core layer, and the surface circuit of the module structure embedded in the core layer can be electrically connected via the process of adding circuit layer, thus enhancing the electrical property of electronic devices by integrating the module structure.

Referring to FIG. 7, a section view of a semiconductor package integrated with the above module structure having embedded chips is illustrated. As shown in the figure, the module structure having embedded chips 7a can be arranged in any dielectric layer 70. A process of adding circuit layer is processed to the dielectric layer 70 to form circuit multilayer structure 71, so that the circuit multilayer structure 71 can be electrically connected to the circuit structure 74 on the surface of the module structure having embedded chips 7a, and further electrically connected to external electronic devices, for example, arranging and electrically connecting semiconductor chips 78 and passive element 77 on the upper surface, and planting a plurality of solder balls 79 on the lower surface, thus enhancing the electrical property of electronic devices by integrating the module structure.

Referring to FIG. 8, a section view of the above module structure having embedded chips embedded in a circuit board is illustrated. As shown in the figure, the module structure having embedded chips 8a can be embedded in any layer of the circuit board 8, and electrically connected to the circuit layer 80 of the circuit board 8 to form a module electronic package or assembly package.

It is to be particularly noted that, the module structure having embedded chips shown in FIG. 6 to FIG. 8 can be replaced with any one of the module structure having embedded chips descried in the first to forth embodiments (shown in FIG. 2 to FIG. 5).

Consequently, the module structure having embedded chips can be employed in the fabricating process of various kinds of electronic devices to embedding module structure in the electronic devices, so that the circuit structure formed on the surface of the module structure can be electrically connected to other electronic devices via various kinds of conductive structures (such as conductive blind holes, conductive bumps, or plated conductive through hole), thus shortening the length of layout, enhancing electrical property and providing multifunctional and high density electronic devices. At the same time, in the fabricating of electronic devices, fabricating time can be saved via integrating pre-fabricated module structure having embedded chips, which is suitable for mass production.

It should be apparent to those skilled in the art that the above description is only illustrative of specific embodiments and examples of the present invention. The present invention should therefore cover various modifications and variations made to the herein-described structure and operations of the present invention, provided they fall within the scope of the present invention as defined in the following appended claims.

What is claimed is:

1. A module structure having embedded chips, comprising:
    a first dielectric layer;
    at least a semiconductor chip comprising an active surface and a non-active surface opposing the active surface, the semiconductor chip attached to the first dielectric layer via the non-active surface, a plurality of electrical connection pads formed on the active surface;
    a second dielectric layer formed on the first dielectric layer, for embedding the semiconductor chip between the first and second dielectric layers;
    a circuit structure formed on the second dielectric layer, the circuit structure electrically connected to the electrical connection pads on the active surface of the semiconductor chip via a plurality of conductive structures;
    another circuit structure formed on the outer surface of the first dielectric layer; and
    a conductive through hole extending through the first and second dielectric layers, for electrically connecting the circuit structures on the surface of the first and second dielectric layers, thus embedding the module structure in an electronic device, and electrically connecting the electronic device via the circuit structures.

2. The module structure having embedded chips as claimed in claim 1, wherein the circuit structure on the surface of the first dielectric layer also serves as a heat dissipating layer for dissipating the heat generated by the semiconductor chip.

3. The module structure having embedded chips as claimed in claim 1, wherein the semiconductor can be selected as one of the active chip and passive chip.

4. The module structure having embedded chips as claimed in claim 1, wherein the conductive structure can be selected as one of the conductive blind hole and conductive bump.

5. The module structure having embedded chips as claimed in claim 1, wherein the first dielectric layer and second dielectric layer are made of different material.

6. The module structure having embedded chips as claimed in claim 1, wherein the first dielectric layer and second dielectric layer are made of identical material.

7. The module structure having embedded chips as claimed in claim 1, wherein the electronic device can be selected as one of the IC substrate, semiconductor device and circuit board, for further packing.

8. The module structure having embedded chips as claimed in claim 1, wherein the module structure having embedded chips can be embedded in electronic devices, and outwardly electrically extended to form circuit multilayer structure by being processed with a process of adding circuit layer thereto.

9. A module structure having embedded chips, comprising:
    a first dielectric layer;
    a core layer attached to the first dielectric layer, the core layer defining at least an opening;
    at least a semiconductor chip attached to the first dielectric layer and accommodated in the opening of the core layer, a plurality of electrical connections pads formed on an active surface of the semiconductor chip;
    a second dielectric layer formed on the first dielectric layer sandwiching the core layer, filling the first and second dielectric layers into the opening of the core layer, thus securing the semiconductor chip in the opening of the core layer;
    a circuit structure formed on the second dielectric layer, the circuit structure electrically connected to the electrical connection pads on the active surface of the semiconductor chip via a plurality of conductive structures;
    another circuit structure formed on the outer surface of the first dielectric layer; and a conductive through hole extending through the first dielectric layer, core layer, and second dielectric layer, for electrically connecting the circuit structures on the surface of the first and second dielectric layers, thus embedding the module structure in the electronic device, and electrically connecting the electronic device via the circuit structures.

10. The module structure having embedded chips as claimed in claim 9, wherein the circuit structure on the surface of the first dielectric layer also serves as a heat dissipating layer for dissipating the heat generated by the semiconductor chip.

11. The module structure having embedded chips as claimed in claim 9, wherein the conductive structure can be selected as one of the conductive blind hole and conductive bump.

12. The module structure having embedded chips as claimed in claim 9, wherein the semiconductor can be selected as one of the active chip and passive chip.

13. The module structure having embedded chips as claimed in claim 9, wherein the core layer can be selected as one of the insulated plate, metal plate and ceramic plate.

14. The module structure having embedded chips as claimed in claim 9, wherein the first dielectric layer and second dielectric layer are made of different material.

15. The module structure having embedded chips as claimed in claim 9, wherein the first dielectric layer and second dielectric layer are made of identical material.

16. The module structure having embedded chips as claimed in claim 9, wherein the electronic device can be selected as one of the IC substrate, semiconductor device and circuit board, for further packing.

17. The module structure having embedded chips as claimed in claim 9, wherein the module structure having embedded chips can be embedded in electronic devices, and outwardly electrically extended to form circuit multilayer structure by being processed with a process of adding circuit layer thereto.

* * * * *